United States Patent [19]

Svedberg

[11] Patent Number: 4,969,023
[45] Date of Patent: Nov. 6, 1990

[54] SOS TRANSISTOR STRUCTURE

[75] Inventor: Per Svedberg, Vällingby, Sweden

[73] Assignee: Asea Brown Boveri AB, Västerås, Sweden

[21] Appl. No.: 235,075

[22] Filed: Aug. 23, 1988

[30] Foreign Application Priority Data

Aug. 24, 1987 [SE] Sweden ................. 8703269

[51] Int. Cl.$^5$ ............... H01L 29/78; H01L 29/06; H01L 27/12
[52] U.S. Cl. ................. 357/23.7; 357/20; 357/4
[58] Field of Search ............... 357/23.7, 4, 20

[56] References Cited

U.S. PATENT DOCUMENTS 4,797,721  1/1989  Hsu .................. 357/23.7

FOREIGN PATENT DOCUMENTS 51-147186  12/1976  Japan .
027069    2/1982   Japan .................. 357/23.7
190362    11/1982  Japan .................. 357/23.7
58-98969  6/1983   Japan .

OTHER PUBLICATIONS

Toshio Kumamoto, et al., "An SOI Structure for Flash A/D Converter" IEEE Journal of Solid-State Circuits, vol. 23, No. 1, Feb., 1989, pp. 198-201.

Primary Examiner—Rolf Hille
Assistant Examiner—Robert P. Limanek
Attorney, Agent, or Firm—Pollock, Vande Sande & Priddy

[57] ABSTRACT

A MOS transistor is formed in a silicon layer applied on an insulating base. The channel region of the transistor has a weakly doped region located nearest the surface of the layer and a more heavily doped region nearest the base. The latter region extends in under the source region of the transistor and is connected to the source contact of the transistor via a highly doped region of the same conduction type. The more heavily doped region is doped with a doping dose of at least $2.10^{12}$ cm$^{-2}$.

3 Claims, 11 Drawing Sheets

SOS TRANSISTOR STRUCTURE

TECHNICAL FIELD

The present invention relates to a MOS transistor formed in a semiconductor layer arranged on an insulating base and with source and drain regions of a first conduction type separated by a channel region of a second conduction type, the channel region having a more heavily doped part nearest the base and a more weakly doped part nearest the surface of the semiconductor layer, the source contact being connected to the source region, a drain contact being connected to the drain region and a control electrode being arranged on top of the channel region and separated therefrom by an insulating layer.

BACKGROUND ART

A prior art transistor of the above-mentioned kind is shown in FIGS. 1a–1d. It is made in so-called SOS technique ("Silicon-On-Sapphire" technique). It is usually included in an integrated circuit with a large number of transistors, the different transistors being formed in separate silicon layers, arranged on a base of sapphire. Transistors of the opposite type—a P-transistor and an N-transistor—usually cooperate two and two in so-called CMOS circuits (complementary MOS circuits). Such a circuit is shown in FIGS. 1a to 1d.

FIG. 1a shows a section through a circuit of the above-mentioned kind. On the sapphire base 1 two rectangular silicon layers for transistors 2 and 3 are applied. The layer consists of a P-transistor 2 whose source 4 and drain 6 consist of highly doped P-conducting layers. The channel region 9 is a slightly N-doped layer. Above this and separated from the silicon by a thin insulating silicon dioxide layer 10, the control contact 11 of the transistor is arranged, which control contact consists of a layer of N-conducting polycrystalline silicon. The sapphire base and the transistor, with the exception of the contacted parts of the source and drain regions, are covered by a protective layer 12 of silicon dioxide. The source region 4 is contacted by a metal layer 13 and the drain region 6 by a metal layer 14.

The N-transistor 3 has heavily N-doped source and drain regions 22 and 20 and a channel region 24 which is slightly P-conducting. Above the channel region the control oxide layer 26 and the control electrode 27 are arranged. The transistor has a source contact 28, and its drain contact consists of the metal layer 14 which also constitutes a drain contact for the P-transistor 2.

FIG. 1b shows a section through the transistor 3, which section is perpendicular to the section in FIG. 1a and passes through the channel region 24. As will be clear from the figure, the control oxide layer 26 and the control contact 27 follow both the upper surface of the silicon layer and the two edge surfaces thereof.

FIG. 1c shows the transistor 3 with source and drain regions 22 and 20 and the channel region 24. The contact surfaces of the drain contact 14 and the source contact 28 with drain and source regions are shown in dashed lines. The control contact 27 is also shown in dashed lines.

FIG. 1d shows the circuit diagram of the CMOS transistor. The drain contacts of the transistors are electrically connected together since they consist of one and the same metal layer 14. The source contact 13 of the transistor 2 is connected to a positive supply voltage, and the source contact 28 of the transistor 3 is connected to a negative supply voltage. The control contacts 11 and 27 of the transistors are connected together and constitute the input of the circuit, to which an input signal Ui is supplied. The common drain contact 14 constitutes the output of the circuit, where the output signal Uu of the circuit is obtained.

In the known type of CMOS circuits described above, a space charge region occurs at the N-transistor at the junction between the drain and channel regions of the transistor. At sufficiently high supply voltage, electron hole pairs are formed in the space charge region. The holes travel to the channel region and cause this to become charged, which acts in the same way as a positive control voltage. The non-linearity caused thereby is a disadvantage in the case of analog operation of the CMOS circuit. It is known that this disadvantage may be reduced if the channel region is connected to the source region (is "grounded"). However, it has proved to be difficult to bring about an effective improvement in this way, primarily because the resistance between the source contact and the central parts of the channel region is high as a result of the weak doping of the region. For the same reason, known transistors of this kind possess less satisfactory high-frequency properties; further, they are impaired by noise caused by the surface state at the junction between the sapphire and the channel region.

Such a transistor is known from Patent Abstracts of Japan, abstract of JP No. 51-147186 (Fujitsu K. K.), Dec. 17, 1976. The superficial part of the channel region must have low doping—a doping dose of the order of magnitude of at most $10^{11}$ cm$^{-2}$—for the threshold voltage of the transistor to receive a useful value. The channel region of this known transistor is obviously homogeneous, i.e. with uniform doping within the entire region. This is the reason why this known transistor suffers from the disadvantages mentioned in the preceding paragraph.

A transistor of a similar kind is described in the IEEE Journal of Solid-State Circuits, Vol. 23, No. 1, pages 198–201, which was published as late as in Feb. 1988.

From Patent Abstracts of Japan, abstract of JP No. 58-98969 (Nippon Denki K. K.), Jun. 13, 1983, a transistor is known which has a metal silicide layer nearest the substrate and partly below the channel region, the metal silicide layer being connected to the source contact of the transistor. The silicide layer is stated to provide elimination of certain parasitic effects. However, for reasons of manufacturing technique, it is difficult and complicated to manufacture a silicide layer of this kind, and such a layer involves a clear risk of leakage currents.

In known MOS transistors of the kind referred to here, it has proved that the highly doped source and drain regions tend to creep towards each other, during the manufacture, within that part of the silicon layer which is located at a greater depth below the surface. In these transistors, therefore, the length of the channel region must be kept greater than what would otherwise have been necessary.

Furthermore, it has been found that these known transistors are relatively sensitive to radiation. Radioactive radiation, for example gamma radiation, gives a positive charge of the sapphire, whereby an N-channel is induced in the surface of the slightly doped channel region, which surface faces the sapphire.

As will be clear from FIG. 1b, a transistor of the above kind consists of a main portion on the plane surface of the silicon layer and two "corner transistors" 31 and 32. Since the control electrode at the corners 31 and 32 influences the silicon layer from two directions, the effective threshold voltage will be lower (and the leakage currents higher) at the corners than on the plane surface of the transistor. It has also been found that the silicon oxide layer 26 becomes thicker at the edges below the corners 31 and 32. This causes the threshold voltage there to become more radiation-sensitive than for the main portion. Taken together, these effects at the corners and edges lead to a deterioration of the properties of the transistor as a whole. The requirements for accurate control of the manufacturing process will therefore be high to avoid that this deterioration becomes too great.

DISCLOSURE OF THE INVENTION

The invention aims to provide a transistor of the kind mentioned in the introduction, which exhibits a high constant gain, improved high frequency properties, low noise, lower leakage currents (and hence lower losses), and a high radiation sensitivity, which permits the use of narrower channel regions and hence lower operating voltages, and which places lower demands for the control of the manufacturing process in view of the properties of the transistors at the edges of the transistors.

What characterizes a transistor according to the invention will become clear from the appended claims.

BRIEF DESCRIPTION OF THE DRAWINGS

The invention will be described in greater detail in the following with reference to the accompanying FIGS. 1-7, wherein.

DESCRIPTION OF THE PREFERRED EMBODIMENTS

Figure 1A:
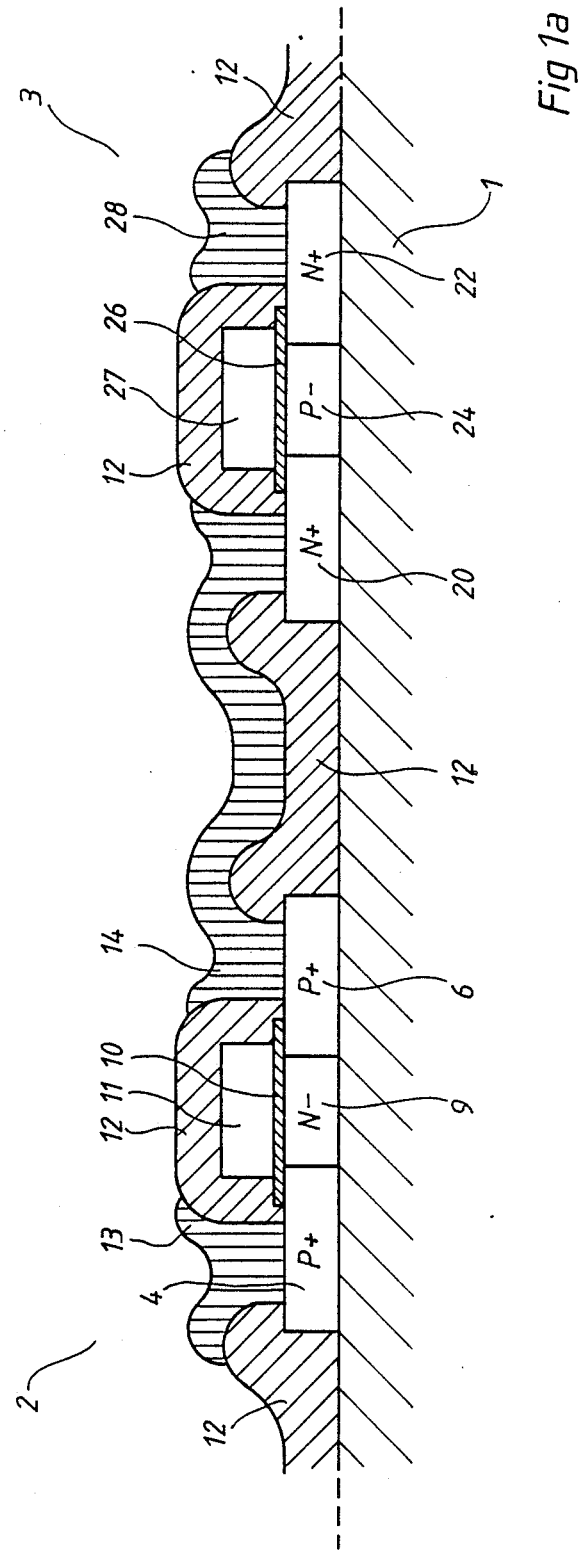
FIGS. 1a–1d show a known CMOS circuit and have been dealt with above.
Figure 1B:
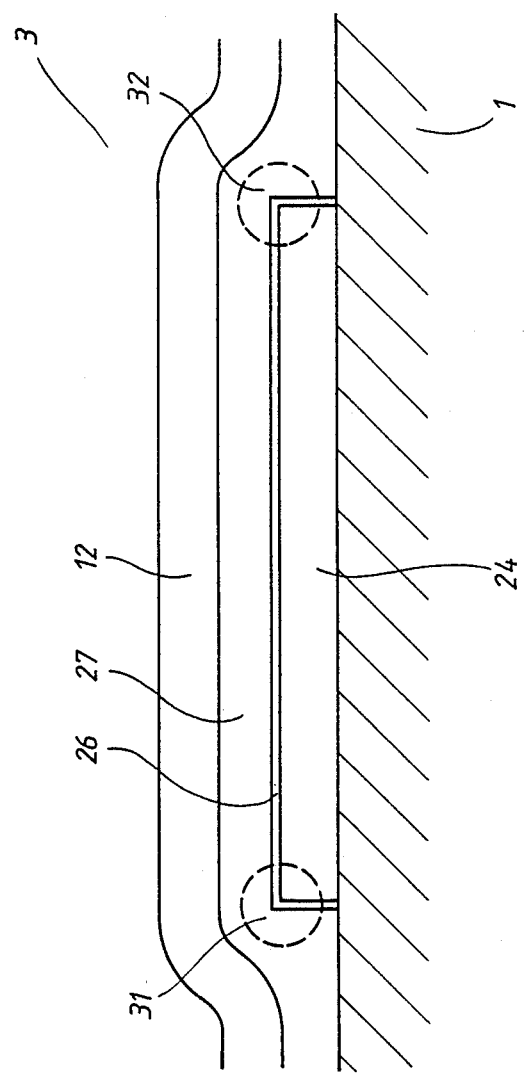
Figure 1C:
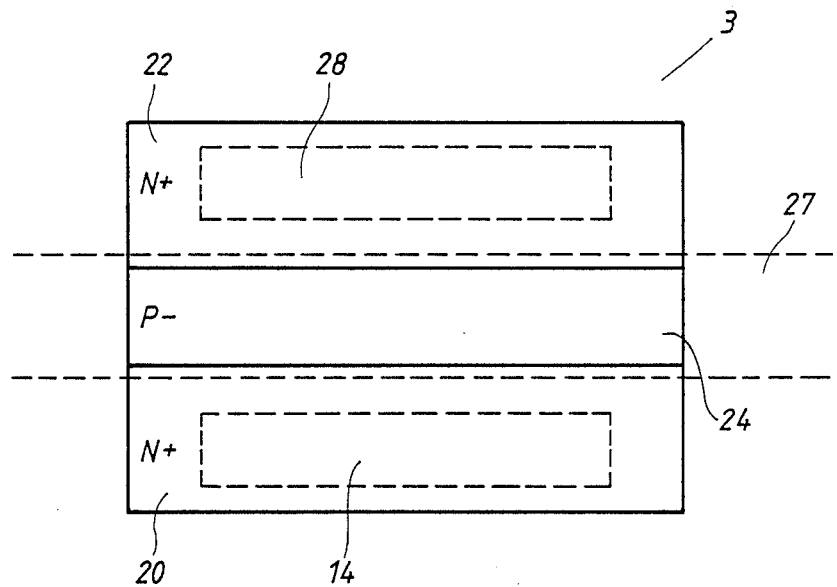
Figure 1D:
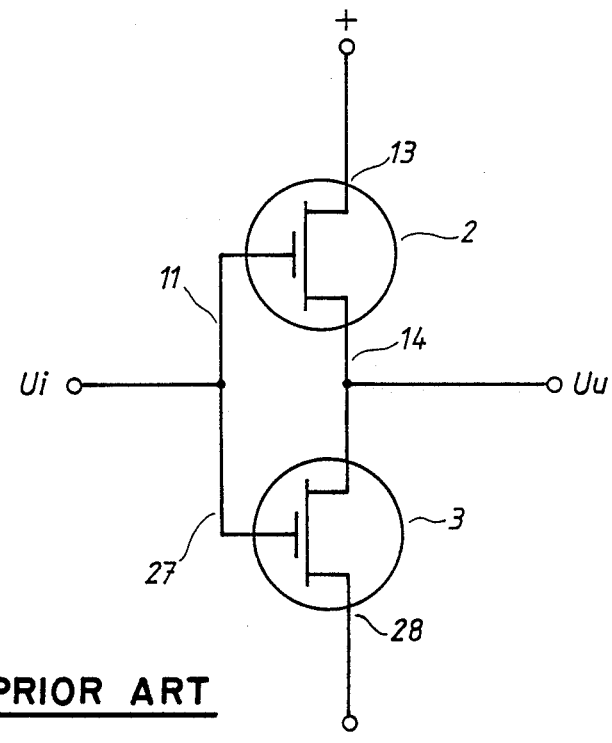
Figure 2A:
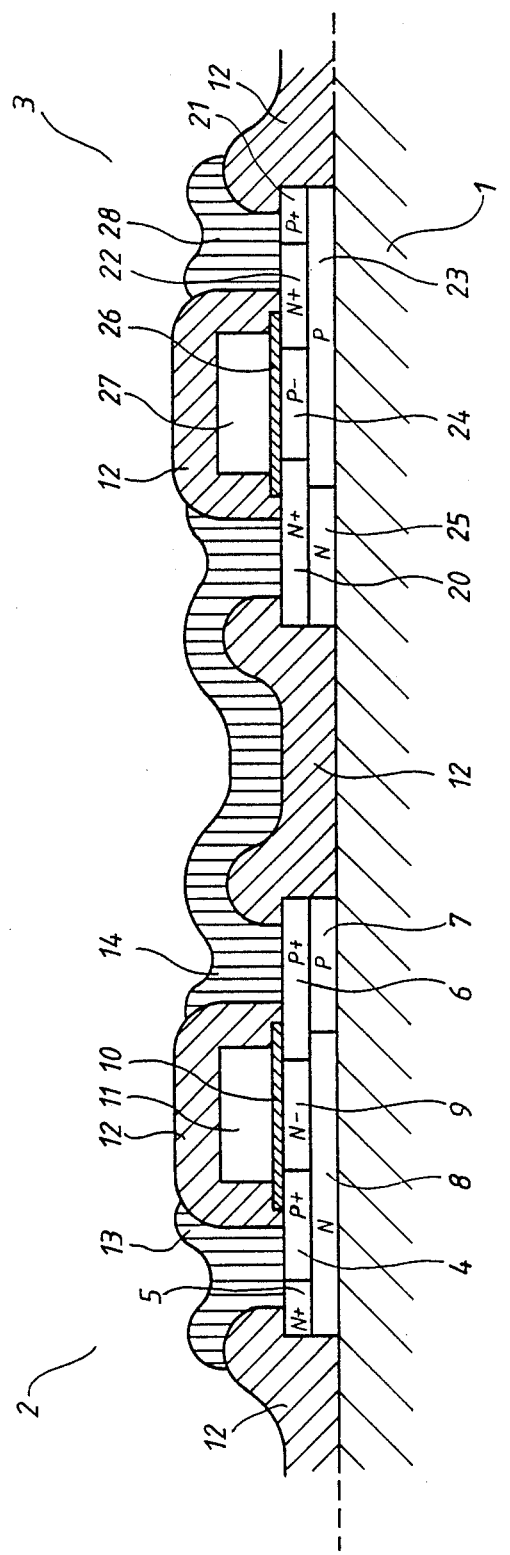
FIG. 2a shows a section through a CMOS circuit according to the invention, designed for effective grounding of the channel region.

FIG. 2a shows a section through a transistor pair 2, 3 which forms a CMOS circuit. As with the known circuit shown in FIGS. 1a to 1d the two transistors are formed in two silicon layers arranged on a sapphire base 1. Instead of sapphire, an arbitrarily insulating material with suitable properties may be used, for example aluminum oxide or a silicon oxide layer arranged on a silicon base. The thickness of the silicon layer may be 0.3–0.6 μm. The source, drain and control contacts 13, 28, 14, 11, 27 and the insulating and protective layers 10, 26, 12 have the same design as in the case of the circuit shown in FIG. 1a to 1d.

The P-transistor 2 has the source region 4 and the drain region 6, 7. The latter has a more highly doped part 6 arranged nearest the silicon surface, and a more weakly doped part 7 arranged nearest the sapphire base. The channel region has a more weakly doped part 9 and a more heavily doped part 8 located at a lower level. The latter doped part 8 extends laterally in under the source region 4 and is connected to a heavily doped part 5 arranged at the surface. The source contact 13 also contacts the region 5.

In similar manner, the drain region 20, 25 of the N-transistor 3 has a superficial highly doped part 20 and a part 25, located at a lower level, with a weaker doping. The channel region has a more weakly doped part 24 located nearest the surface, and a more heavily doped part 23 located nearer to the sapphire base, the latter part extending laterally in under the source region 22 and being connected, via a highly doped region 21, to the source contact 28.

The different regions have been generated by ion implantation of dopants, for example phosphorous for the N-conducting regions and boron for the P-conducting regions. The doping dose is, for example,

| P−/N− | $10^{11}$ cm$^{-2}$ |
|---|---|
| P/N | $10^{13}$ cm$^{-2}$ |
| P+/N+ | $10^{15}$–$10^{16}$ cm$^{-2}$ |

The doping dose of the more heavily doped parts 8 and 23 of the channel regions should exceed $2$–$3 \cdot 10^{12}$ cm$^{-2}$ in order to obtain the favorable properties of a device according to the invention.

Figure 2B:
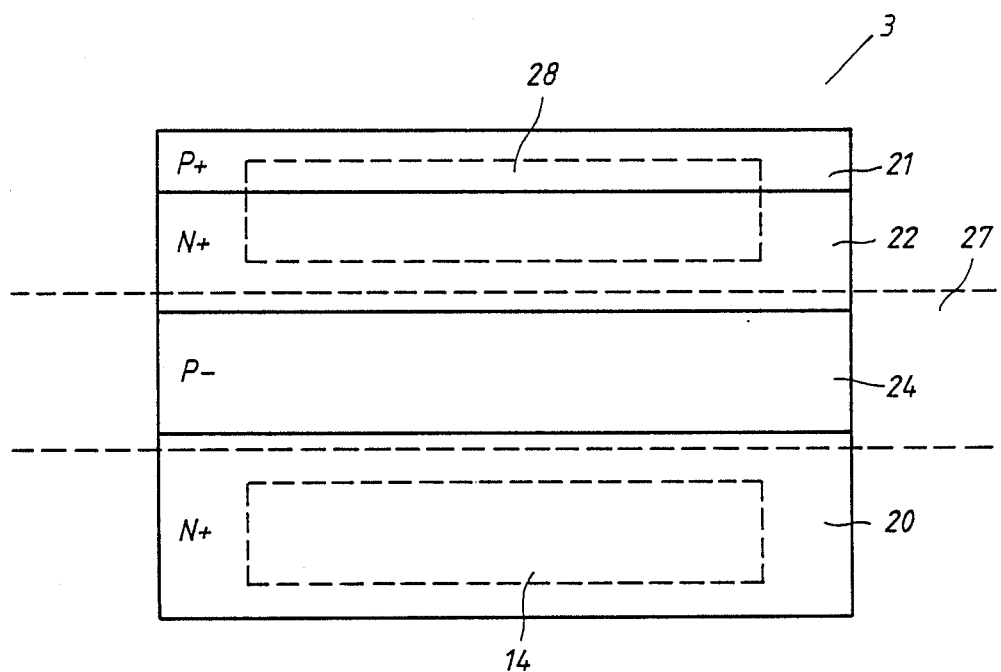
FIG. 2b shows a plan view of the N-transistor included in the circuit.

FIG. 2b shows a plan view of the N-transistor 3 with the source and drain contacts 28, 14 shown in dashed lines. The transistor has the cross-section shown in FIG. 2a along its entire length. The P-transistor 2 is constructed in the same way.

With the aid of the lower, more heavily doped layers 8 and 23, respectively, of the channel region, a low-resistive connection between the source contact and all parts of the channel region, and hence an efficient grounding of the channel region to the source contact, are obtained in the transistor according to FIGS. 2a and 2b. In this way, the non-linearities of prior art transistors, mentioned in the introductory part of the description, are eliminated and better high frequency properties are obtained. Further, a considerable improvement of the noise properties of the transistor is obtained. Finally, the above-mentioned charge effect is eliminated, which makes the transistor considerably less sensitive to radioactive radiation. Further, the higher doping of the lower part of the channel region reduces or eliminates the risk of the source and drain regions creeping towards each other, as mentioned above. In this way, shorter channels and higher operating voltages can be used than what has previously been possible. The weaker doping of the lower parts 7, 25 of the drain regions also contributes to the reduced risk of the source and drain regions creeping together.

Figure 3A:
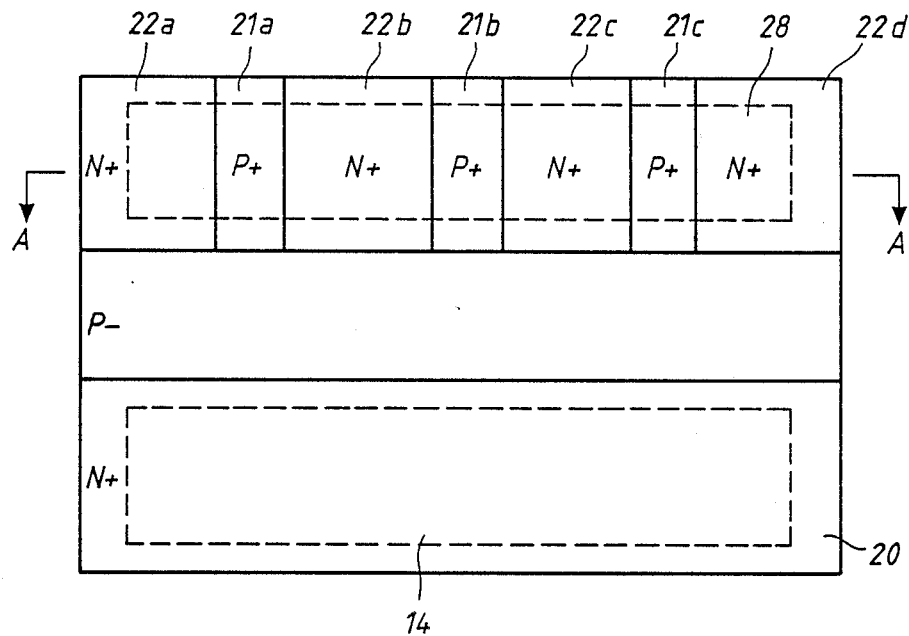
FIG. 3a shows a plan view of an alternative embodiment of the N-transistor.
Figure 3B:
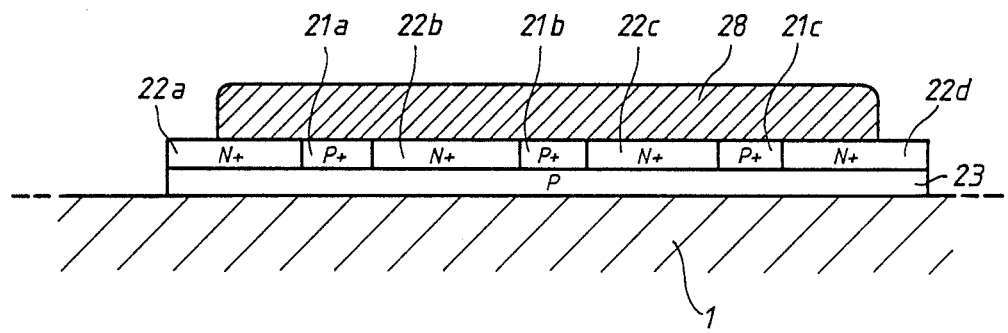
FIG. 3b shows a section through the transistor.

FIG. 3a shows a plan view of an N-transistor according to an alternative embodiment of the invention, and FIG. 3b shows a section at A—A through the transistor.

Instead of the P+ — layer 21 shown in FIGS. 2a and 2b, extending along the length of the entire transistor are a plurality of separate layers 21a–21c arranged on top of the P-layer 23, according to FIGS. 3a and 3b and distributed along the transistor. In this way, the source region 22 is divided into a plurality of separate regions 22a–22d. The number of P+ — layers may be both greater and smaller than that shown in FIGS. 3a and 3b (three). Possibly, only one single P+ — layer with the same embodiment as the layer 21b in FIGS. 3a and 3b may be arranged.

The P+ — layers 21 need not, as in FIGS. 3a and 3b, extend all the way to the channel region 24 but may terminate at a distance therefrom, whereby the source region 22 becomes one single cam-shaped, coherent region.

Figure 4A:
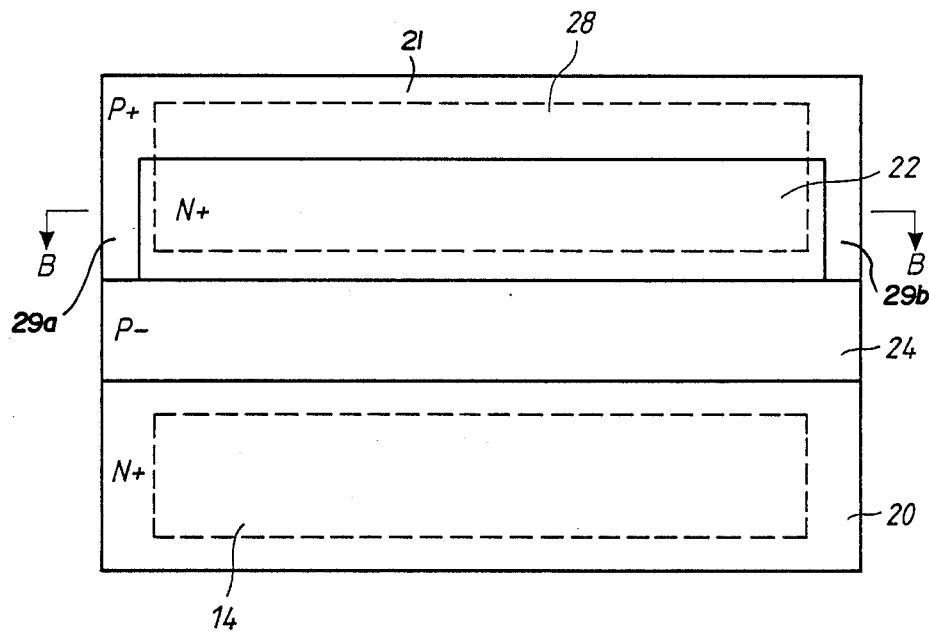
FIG. 4a shows an N-transistor according to the invention, which is formed for elimination of the problems at the edge of the transistor.
Figure 4B:
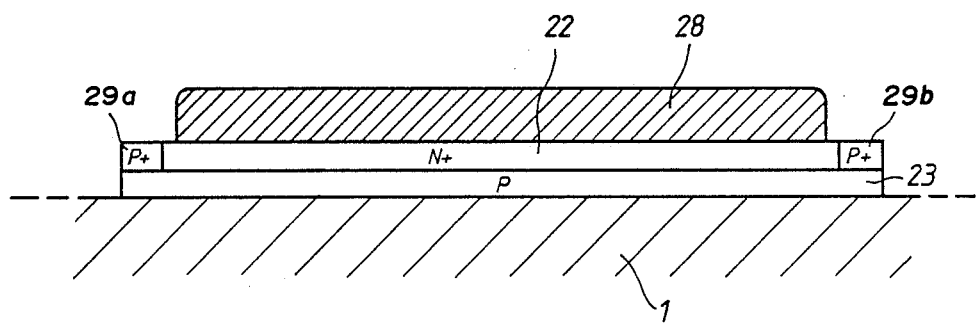
FIG. 4b shows a section through the transistor.

FIG. 4a shows a plan view of and FIG. 4b a section B—B through an N-transistor according to a further embodiment of the invention. It differs from that shown in FIGS. 2a and 2b by portions 29a and 29b of P+ — layer 21 at both ends of the transistor extending to the channel region 24. This eliminates the "corner transistor parts" 31 and 32 in FIG. 1b. This gives, inter alia, the following considerable advantages lower leakage current and hence lower losses,
enables operation at lower voltage,
improved noise properties,
reduced sensitivity to radiation, and
reduced demands for exact process control.

Figure 5:
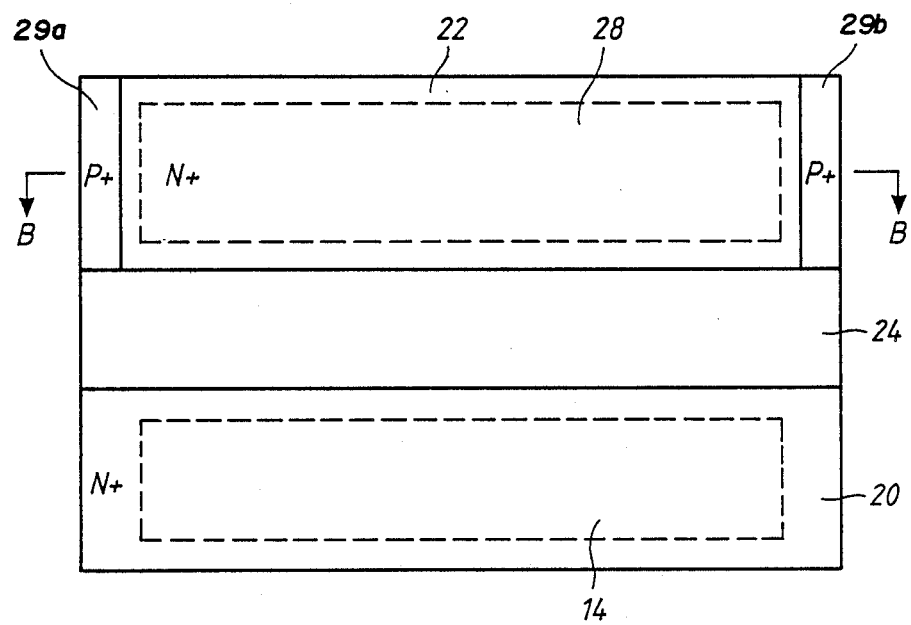
FIG. 5 shows a further embodiment of an N-transistor, which lacks the connection of the channel region to the source region.

The "edge stop" according to FIGS. 4a and 4b can be used, as shown in FIG. 4b, together with a grounding of the channel region. Alternatively, as shown in FIG. 5, it can be used in such a transistor in which the channel region is not grounded to the source contact. The width of the "edge stop", i.e. the extension along the control electrode counting from the edge, should be at least as large as the thickness of the silicon layer.

Figure 6:
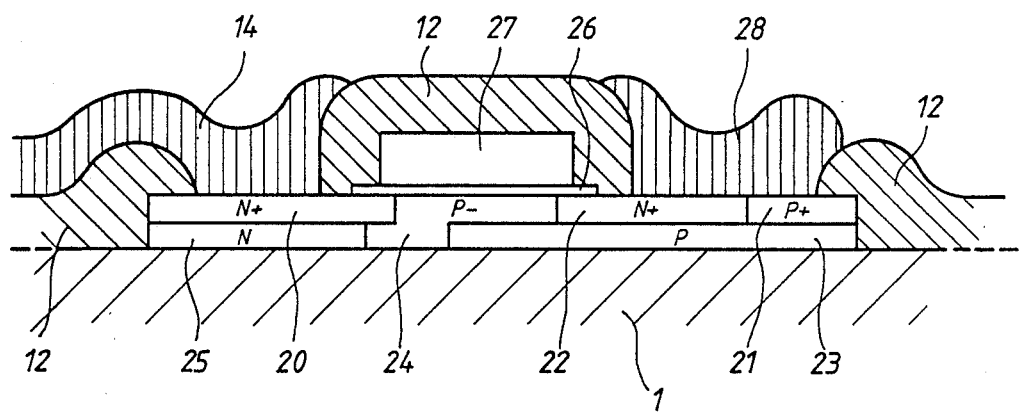
FIG. 6 shows a section through an N-transistor according to the invention, in which the more heavily doped part of the channel region does not extend all the way to the drain region.

FIG. 6 shows a further alternative embodiment of the invention. It corresponds to the N-transistor shown in FIGS. 2a and 2b with the exception that the lower, more heavily doped part 23 of the channel region does not extend to the drain region 20—25.

Figure 7A:
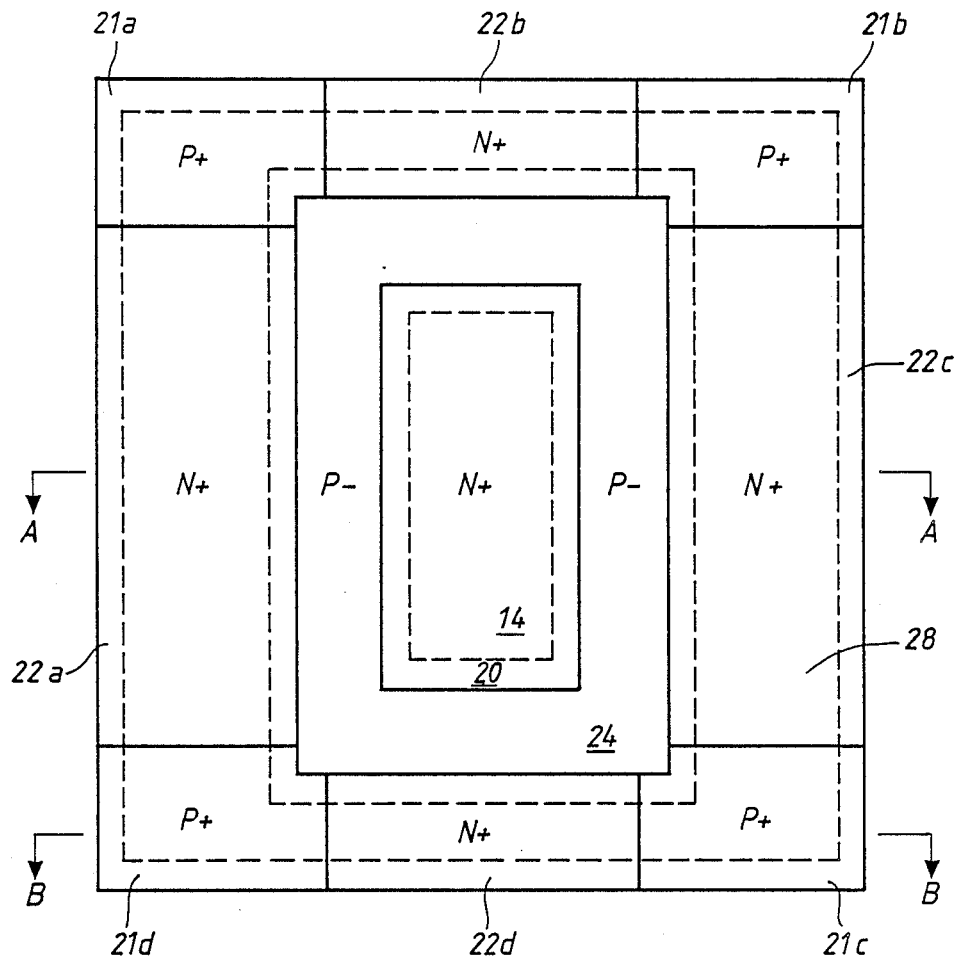
FIG. 7 shows a so-called closed transistor according to the invention.
Figure 7B:
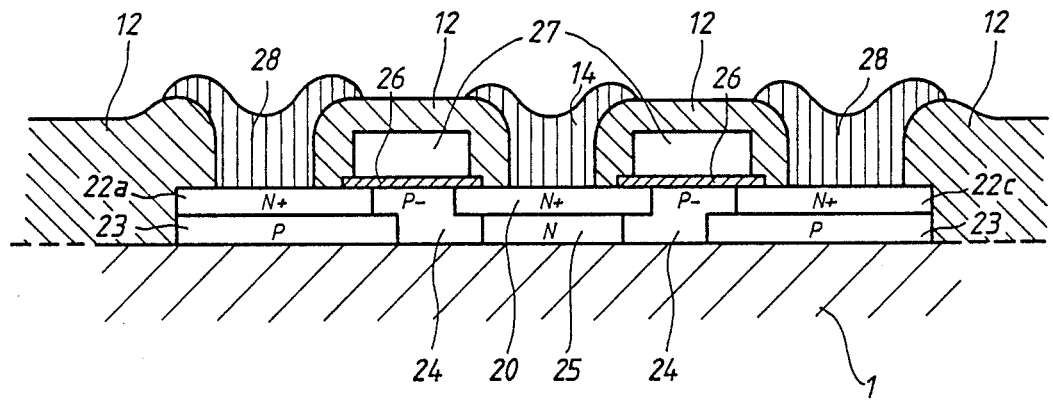
Figure 7C:
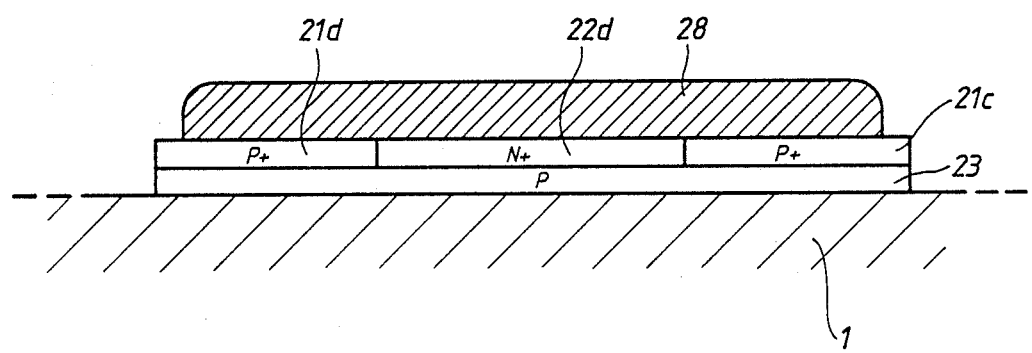

With reference to FIGS. 1-6 above, the invention has been described as applied to a so-called edge transistor, i.e. a transistor in which the channel region extends out to the edge of the silicon layer. FIGS. 7a to 7c show how the invention can be applied to a so-called closed transistor, i.e. a transistor in which the channel region is surrounded by the source or drain region (in the case shown in FIG. 7a by the source region) of the transistor. FIG. 7a shows a plan view of a closed N-transistor, FIG. 7b a section at A—A through the transistor in FIG. 7a, and FIG. 7c a section at B—B. The reference numerals correspond to those used with reference to FIG. 2. The drain region 20, 25 of the transistor is located in the center thereof. The drain region is surrounded by the channel region 24 with its more heavily doped part 23, located at a lower level, which extends in under the source region 22, which in turn surrounds the channel region. In each one of the corners of the transistor, P+ — layers 21a–21d are arranged between the layer 23 and the surface of the silicon layer. In this way the source region 22 is divided into four partial regions 22a–22d. The drain contact 14 and the annular source contact 28 are shown in dashed lines in FIG. 7a. The transistor according to FIGS. 7a to 7c exhibit the same advantages as the transistor shown in FIGS. 2 and 3; and since it is a closed transistor, no problems with "corner transistors" arise. To render the grounding even more effective, the P+-region can be formed as in FIGS. 2 and 3.

In the foregoing, only that case has been described in which those semiconductor layers in which the transistors are formed consist of silicon, and in which the insulating layers consist of silicon oxide. The invention can, of course, be applied to other semiconductor materials than silicon and to other forms of protective and insulating layers than silicon oxide.

I claim:

1. A MOS transistor formed in a semiconductor layer, and arranged on an insulating base, comprising:

a channel region of a first conduction type having a more heavily doped part adjacent to the base and a more weakly doped part extending to the surface of the semiconductor layer;

source and drain regions of a second conduction type contiguous to opposite edges of, and separated by, the weakly doped part of the channel region;

a source contact being connected to the source region;

a drain contact being connected to the drain region;

a control electrode being arranged on top of said more weakly doped part of the channel region and separated therefrom by an insulating layer;

said channel region and said control electrode extending to opposite edges of said semiconductor layer;

wherein said more heavily doped part of the channel region extends under the source region, completely separating the source region from the base;

a second region of said first conduction type being arranged contiguous (a) to the source region,
   (b) to said more heavily doped part of the channel region, and
   (c) to the surface of the semiconductor layer, said second region and said more heavily doped part of the channel region completely separating the source region from said base and from the edges of the semiconductor layer.

2. MOS transistor according to claim 1, wherein said second region is more heavily doped than said more heavily doped part of the channel region.

3. MOS transistor according to claim 1, wherein said source contact is connected to said second region.

* * * * *